United States Patent [19]
Farrer et al.

[11] Patent Number: 5,307,320
[45] Date of Patent: Apr. 26, 1994

[54] HIGH INTEGRATION DRAM CONTROLLER

[75] Inventors: Steven M. Farrer, Santa Clara; Eugene P. Matter, San Jose, both of Calif.

[73] Assignee: Intel Corporation, Santa Clara, Calif.

[21] Appl. No.: 949,708

[22] Filed: Sep. 23, 1992

[51] Int. Cl.$^5$ ............................................. G11C 8/00
[52] U.S. Cl. ........................ 365/230.01; 365/230.03; 365/238.5; 395/425
[58] Field of Search ...................... 365/230.03, 230.01, 365/238.5, 191; 395/425

[56] References Cited

U.S. PATENT DOCUMENTS

| | | | |
|---|---|---|---|
| 4,725,945 | 2/1988 | Kronstadt et al. | 365/230.03 |
| 4,937,791 | 6/1990 | Steele et al. | 365/230.03 |
| 4,967,397 | 10/1990 | Walck | 365/230.03 |
| 5,175,835 | 12/1992 | Beighe et al. | 365/230.03 |

FOREIGN PATENT DOCUMENTS

| | | |
|---|---|---|
| 0281999 | 3/1988 | European Pat. Off. |
| 0393290 | 4/1989 | European Pat. Off. |
| 0440445 | 1/1991 | European Pat. Off. |
| 2226666 | 10/1989 | United Kingdom |
| 2255843 | 5/1992 | United Kingdom |

Primary Examiner—Eugene R. LaRoche
Assistant Examiner—Tan Nguyen
Attorney, Agent, or Firm—Blakely Sokoloff Taylor & Zafman

[57] ABSTRACT

A memory controller for a dynamic random access memory (DRAM) is described. The memory controller of the present invention provides access to a memory array which uses DRAM banks. The memory controller is adaptable to various types of DRAM banks, such that the memory array is capable of having independent and different configurations of DRAM banks in the memory. The memory controller includes multiple programmable storage registers, where one register is associated with every bank location in the memory array. Each of the programmable registers is independently programmed to contain access parameters that are necessary to access its associated bank. The memory controller of the present invention also includes circuitry which is configured to provide each of the banks in the memory with its necessary control signals in the proper sequence and timing according to the access parameters in its associated storage register. In this manner, the present invention is capable of accommodating DRAM banks of different types in the memory array.

15 Claims, 3 Drawing Sheets

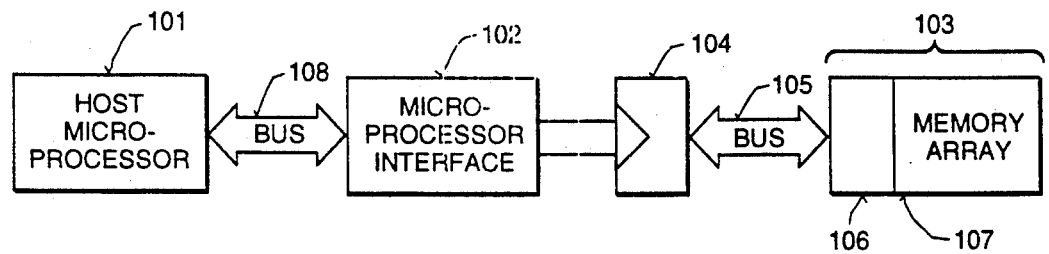
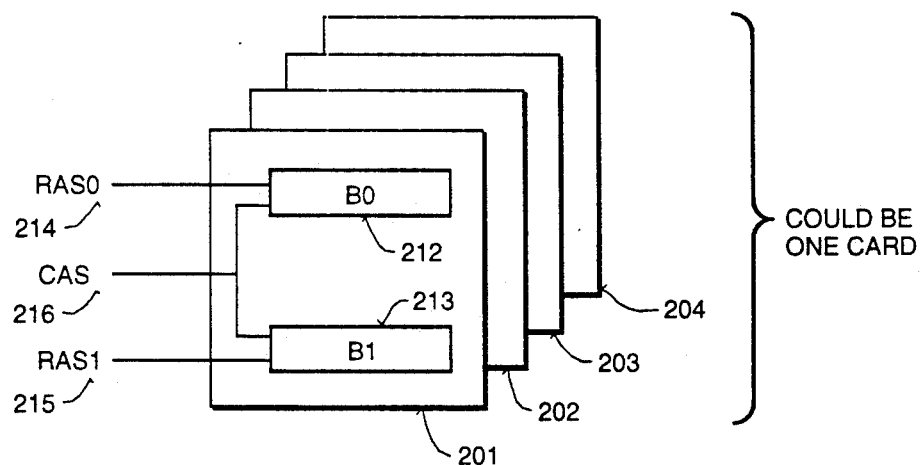
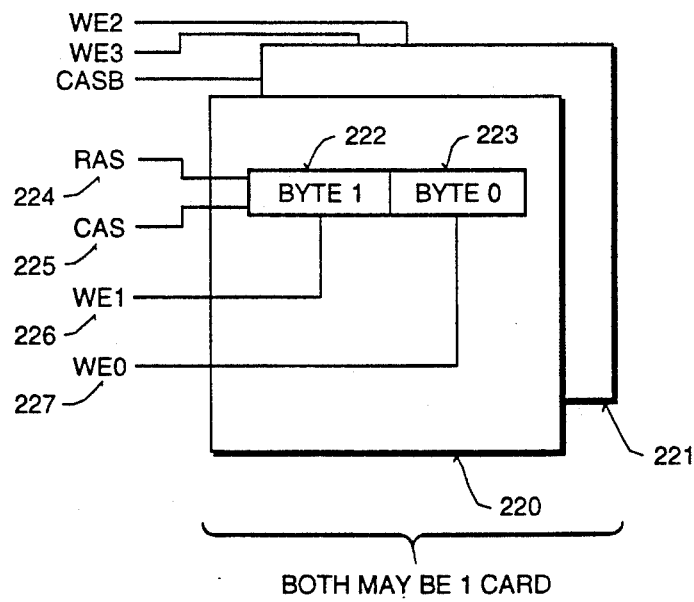

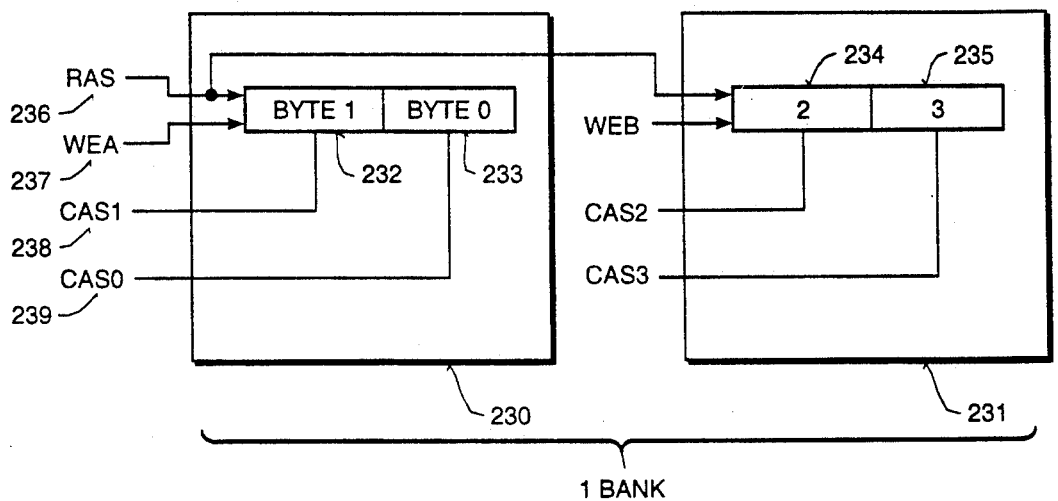
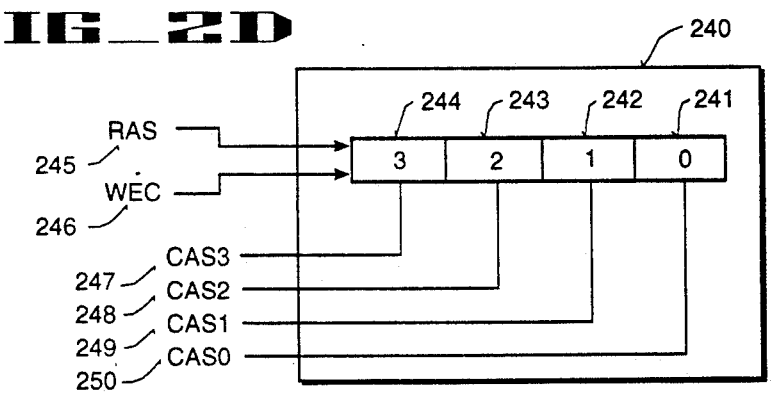
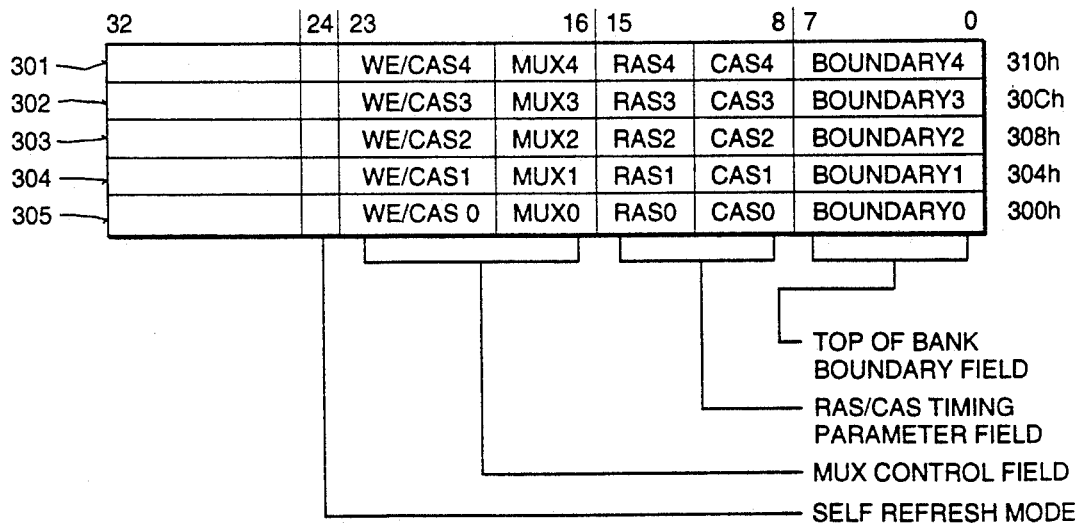

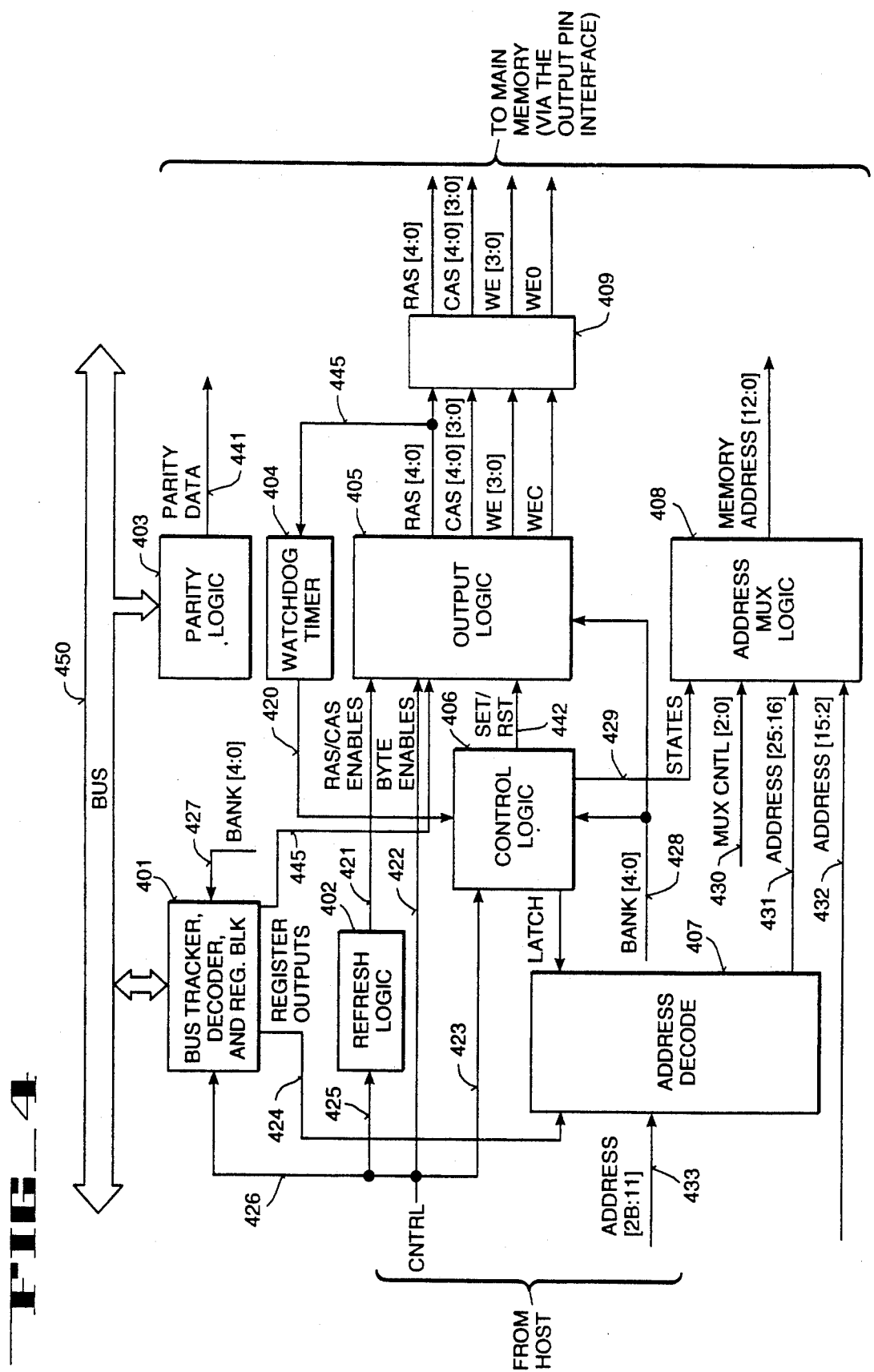
FIG_4

HIGH INTEGRATION DRAM CONTROLLER

FIELD OF THE INVENTION

The present invention relates to the field of memory controllers; more particularly, the present invention relates to dynamic random access memory (DRAM) controllers supporting multiple DRAM column addressing modes.

BACKGROUND OF THE INVENTION

Memory plays an important role in all computer systems. Dynamic random access memories (DRAMs) are commonly used as main memories in computer systems. DRAMs may be configured in bit (×1-bit), nibble (×4-bits), byte (×8-bits), or word (×16-bits) data organizations, and in speeds from about 70 ns to 150 ns. The most popular DRAMs are the large 1-bit types and nibble (×4) types. The DRAMs used in the computer system are typically placed on interchangeable memory cards.

In accessing a typical DRAM, multiplexed addresses are used and are split into two groups. One group designates the address of the row, while the other is used to address the column. The two groups are multiplexed onto the pins of the DRAM, first the row address signaled by a row address strobe (RAS), then the column address signaled by a column address strobe (CAS). The data is written or read to the DRAM according to a write enable (WE) signal (that follows the assertion of the CAS). There are several ways to generate the proper sequence of multiplexed addresses, RAS, CAS, and WE signals that are needed to utilize a DRAM.

Some high integration central processing unit (CPU) based systems incorporate multi-bank DRAMs. To control access to the multi-bank DRAMs, a DRAM memory controller is utilized. The DRAM memory controller generates the individual CAS signals and WE signals for each of the DRAM banks. Recently, newer DRAM configurations have become available which permit access according to a differing interface of signals. Some of these newer DRAM memory cards have multiple banks which selectively share individual CAS and WE signals. In these configurations, the CAS signals or the WE signals are logically "ORed" across bytes within the bank or across DRAM banks. In other words, some DRAM cards require one CAS and two WE signals per card or two CAS signals and one WE signal per card. Furthermore, in some single or multi-bank DRAM memory cards, CAS signals and WE signals for one bank may be used by a second DRAM bank. Thus, these newer DRAM cards share CAS signals and WE signals within a bank and across DRAM banks.

To provide an interface to the newer forms of DRAM memory cards, external logic is required. External logic provides the logical "ORing" of either the CAS or WE signals. However, the external logic introduces unwanted delays which may compromise timing margins. Furthermore, the external logic also adds to the chip count of the system. Moreover, this external logic creates a "fixed," or hard-wired, DRAM interface which precludes the use of removable and reconfigurable DRAM memory cards or a flexible DRAM upgrade.

As will be shown, the present invention programs the DRAM controller to accommodate multiple types of banks. Furthermore, the DRAM controller of the present invention accommodates multiple types of banks at the same time. The DRAM controller of the present invention provides internal logic control of the CAS and WE signals. Thus, the present invention is a DRAM controller that directly supports a wide variety of DRAM devices and also supports DRAM memory cards with no external logic.

SUMMARY OF THE INVENTION

A memory controller for a dynamic random access memory (DRAM) is described. The memory controller of the present invention provides access to a memory array which has at least one DRAM bank. The memory controller is adaptable to various types of DRAM bank, such that the memory array is capable of having different configurations of DRAM banks in the memory.

The memory controller includes multiple programmable storage registers, where one register is associated with every DRAM bank location in the memory array. Each of the programmable registers is programmed to contain access parameters that are necessary to access its associated DRAM bank. The memory controller of the present invention also includes circuitry which is configured to provide each of the DRAM banks in the memory with its necessary control signals in the proper sequence and timing according to the access parameters in its associated storage register. In this manner, the present invention is capable of accommodating DRAM banks of different types in the memory array, even where the memory array has multiple types of DRAM banks at the same time. The organization of the programmable registers is such that a single register can be programmed without affecting other physical DRAM banks. In the currently preferred embodiment, each DRAM bank is associated with a unique 32-bit register to independently control the DRAM timing parameters, DRAM bank size, DRAM row and column addressing and refreshing modes.

BRIEF DESCRIPTION OF DRAWINGS

The present invention will be understood more fully from the detailed description given below and from the accompanying drawings of the preferred embodiment of the present invention, which, however, should not be taken to limit the invention to the specific embodiment, but are for explanation and understanding only.

FIG. 1 illustrates one embodiment of the computer system of the present invention.

FIGS. 2A-2D illustrates different configurations of DRAM devices and DRAM memory cards.

FIG. 3 illustrates the currently preferred embodiment of the programmer registers of the present invention.

FIG. 4 represents a block diagram of the DRAM controller of the present invention.

DETAILED DESCRIPTION OF THE INVENTION

A DRAM controller for controlling access to a DRAM memory is described. In the following description numerous specific details are set forth, such as specific bit numbers, timings, etc., in order to provide a thorough understanding of the preferred embodiment of the present invention. It will be obvious to those skilled in the art that the present invention may be practiced without the specific details. Also well-known devices have been shown in block diagram form, rather than in detail, in order to avoid unnecessarily obscuring the present invention.

In this application, signals will be generally referred to by signal names. Particularly, signal names may be varied without departure from the scope and spirit of the present invention. Further, signal states will be referred to as being active or inactive, as opposed to being high or low, one or zero, true or false, etc. Signals which are active when low are indicated by a bar $\overline{XXXX}$.

In describing groups of signals, a decimal radix conventional may be used, such as using MDA (31:0) to refer to all 32 data lines on a bus. Within each group, the least significant bit of the group is referred to with a suffix of "0". In other words, MDA0 refers to the least significant data line of the bus and MDA 31 refers to the most significant data line.

FIG. 1 illustrates a computer system incorporating main memory 103. Microprocessor interface 102 resides between host microprocessor 101 and controls main memory 103. Information is passed between host microprocessor 101 and microprocessor interface 102 on internal host bus 108. Microprocessor interface 102 outputs information for memory to memory bus buffers 104. Information is passed between microprocessor interface 102, memory bus buffers 104 and main memory 103 via bus 105. As will be described in detail, main memory 103 includes array interface 106 and memory array 107.

The memory interface produces the required row address strobes (RAS), column address strobes (CAS), and write enable (WE) strobes for the memory array. In the present invention, the memory array comprises one or more banks of DRAM memory. Furthermore, each bank could be integrated into the memory array as one card or a series of memory cards. In the currently preferred embodiment, the memory array is capable of having five separate banks of DRAM. The memory is capable of operating with less than five banks. The memory interface is a DRAM controller which provides the RAS, CAS and WE signals for each of the banks. In other words, the DRAM controller is capable of generating the RAS, CAS and WE signals for five separate banks of DRAM. For each bank of memory, the controller of the present invention is capable of supplying one RAS signal, and four CAS signals (i.e., CAS1, CAS2, CAS3 and CAS4, one for each byte). Four WE signals (i.e., WE0, WE1, WE2, WE3, one for each byte) are shared across the banks. However, it should be noted that the present invention could be configured to provide other amounts of RAS, CAS and WE signals depending on the requirements of the DRAM array.

The present invention supports a wide variety of DRAMs and DRAM cards. FIGS. 2A-2D illustrate four DRAM arrangements which are compatible with the present invention. Referring to FIG. 2A, a card 201 is shown with bank0 212 and bank1 213. Cards 202-204 have the same two bank configurations as card 201. The interface to each of cards 201-204 requires two RAS signals shown as RAS0 214 and RAS1 215 and one CAS signal 216 as shown. Each of the other cards utilize the same two RAS signals. However, all of the cards utilize different CAS signals. When a DRAM card utilizes two banks with the common CAS signal, the DRAM controller of the present invention must perform CAS bank ORing on the CAS signals for each bank, such that the CAS for bank0 and the CAS for bank1 produce the common CAS signal 216. Similarly, for cards 202-204, their respective bank0 and bank1 CAS signals must be logically "ORed" to produce a single CAS for accessing each bank. Thus, using bank CAS ORing with all four cards results in two banks of memory configured by 32. Hence, the DRAM controller supplies two RAS signals for each card and performs CAS bank ORing for the DRAM configuration in FIG. 2A. It should be noted that each bank on each card is byte oriented. Therefore, depending on the requirements of the computer system, the memory array could employ one to four of such cards to provide storage space for one byte to four bytes in length. Moreover, one 32-bit card or device could be used instead of four separate one byte cards. In either case, since the DRAM controller is capable of supplying only one RAS per bank and this type of DRAM arrangement requires 2 RAS signals, one for each bank, the DRAM arrangement requires the use of two of the memory banks in the memory array.

FIG. 2B shows another variation of a DRAM. Referring to FIG. 2B, card or device 220 is shown with two bytes, byte1 222 and byte0 223 which are accessed sharing a common CAS signal (CASA) on line 225 and a common RAS signal on line 224, while having separate WE signals, shown as WE1 226 and WE0 227 respectively. Card or device 221 has the same configuration to provide a total of 4 bytes in 1 bank. In this configuration, the CAS signal is shared between two bytes, such that CAS byte ORing must be performed by the DRAM controller of the present invention. Thus, the CAS signal is generated by ORing the CAS0 and CAS1 signals for byte0 and byte1 respectively to produce the CASA signal 225. Card or device 221 contains byte2 and byte3 using the same configuration of a shared RAS and CAS signals with individual WE signals (WE2, WE3). Card or device 221 also requires that the common CAS signal (CASB) be generated by ORing the CAS signal for byte2 (CAS2) and the CAS signal for byte3 (CAS3) to produce the CAS signal. Since cards or devices 220 and 221 require only one RAS signal, CAS signals and the four WE signals, both cards or devices require only one bank in the memory array of the present invention. Even so, the DRAM controller of the present invention could perform CAS byte ORing for a DRAM having all four bytes on the same card or in the same device.

FIG. 2C illustrates another type of DRAM card or device. Two separate cards or devices 230 and 231 are shown, where each card or device uses a WE signal shared across bytes (e.g., WEA 237) along with individual CAS signals (e.g., CAS1 238 and CAS0 239) and a shared RAS signal (e.g., 236) to access each byte of information on the card or device. To produce the shared WE signal for each of cards or devices 230 and 231, the WE signals must be logically ORed. Therefore, for card or device 230 the WE0 for byte0 233 and WE1 for byte1 232 are ORed to produce WEA 237 for both byte1 232 and byte0 233. Similarly, for card 231, the WE signals WE2 and WE3 for byte2 234 and byte3 235 are ORed to produce the common WEB. It should be noted that byte2 234 and byte3 235 also require the same RAS signal as card or device 230 and have their individual CAS signals, CAS2 and CAS3. Since together cards or devices 230 and 231 only require one RAS signal, one CAS signal for each of the bytes (4 total) and only the four WE signals (to generate the two common WE signals) both cards 230 and 231 only utilize one bank in the memory array. It should be noted that both 16-bit (2-byte) blocks can be on the same card or device in a word configured system. The by 16 ($\times$16) card or device would correspond to one or one half of a bank depending on whether the memory data bus is 16 or 32-bits. Similarly, cards or devices 230 and 231 could be configured as one card or two devices for a 32-bit system.

FIG. 2D depicts another DRAM arrangement which is a 32-bit card 240. Card 240 has four bytes: byte0 241, byte1 242, byte2 243 and byte3 244 accessed using CAS 250, CAS 249, CAS 248 and CAS 247 respectively. The bytes share a RAS signal 245 and a common WE signal, referred to as WEC 246. The WEC signal 246 is generated by logically ORing all four WE signals for the bank together. The configuration of FIG. 2D requires one bank of the memory system.

Therefore, the DRAMs that may be used in the system require a memory controller which can support either a single CAS signal and two WE signals per 16/18 bit DRAM device or two CAS signal and one WE signal per device. The present invention provides the capabilities to support any DRAM organization by providing programmable storage devices (e.g., registers) and CAS signal buffers for each DRAM bank. The programmable storage devices are independent configuration registers which control individual CAS and WE signals. The registers determine whether the CAS and WE signals for each DRAM bank is to be internally "ORed." This invention allows the use of any organization of DRAMs to be used in different DRAM banks independently of the other DRAM banks in the memory system. Thus, the programmable set of registers of the present invention control the generation and assertion of individual CAS signals and WE signals for one or more DRAM banks.

The present invention also provides CAS and WE generation for multi-bank DRAM memory cards in which individual CAS and WE strobes may be selectively shared by more than one DRAM bank or byte. The registers of the present invention provide a flexible mechanism to generate CAS signals which may be internally ORed across bytes within a bank or across DRAM banks. The present invention supports DRAMs which may require one CAS and two WE signals or two CAS and one WE signal per device without external logic or decoding. The present invention also supports single or multi-bank DRAM memory cards where the CAS and WE strobes for one bank may be shared by a second DRAM bank. The present invention also provides a user accessible software control and external integrated hardware buffers to support CAS and write enable ORing operations.

FIG. 3 illustrates the currently preferred embodiment of the bank configuration registers of the present invention. Referring to FIG. 3, the currently preferred embodiment uses five registers, 301–305. The bank configuration registers are programmable. The registers are programmable in that software can be used to load the registers with the proper values to configure the interface to the memory bank. The register could be loaded using a menu driven software which permits the user to indicate the type of DRAM in the bank location and any other memory parameters required to permit access to that DRAM bank. Self-configuration software can also be used to program the registers. The self-configuration software scans the memory cards of each bank and determines the type of memory card and configuration required so that access may be gained.

The registers utilized in the present invention can be of any length. In the currently preferred embodiment, the registers are 32 bits long. Each register is associated with a bank in the memory. There are five 32-bit bank registers in the DRAM controller of the present invention. Each register defines all the necessary parameters for a given bank. These registers may be divided into multiple fields. In the currently preferred embodiment, these fields include bank boundary fields, a RAS/CAS timing parameter field, and a MUX control field which controls the address MUX and the WE/CAS output pin definition. In addition, in the currently preferred embodiment, another field in the registers defines the refresh mode that is used by the DRAM.

The bank boundary field specifies the upper limit of the bank's address range. The bank boundary field allows the mapping of the address space into the ranges. The field also includes an enable bank sub-field that indicates whether the bank currently has a memory associated with it. In the currently preferred embodiment, the bank boundary field is bits 0–7 in the bank configuration register. Also in the currently preferred embodiment, the enable bank sub-field comprises one bit, bit 7, and the bank boundary field consists of six bits, bits 0–5 (as shown in FIG. 3 for all five configuration registers).

In the currently preferred embodiment, if the size of bank0 is 1 megabyte, then the boundary value for bank0 is set to 00 h. The range of the next bank is set from the boundary of the previous bank plus one to its own boundary. For instance, the range of bank1 is the boundary of bank 0+1 to the boundary of bank1. Thus, any given bankn will reside in the address range from the boundary specified for bank(n−1)+1 to the address specified by the boundary of bankn.

The RAS/CAS timing parameter field defines the CAS access time, the RAS-to-CAS access time, the RAS Precharge time. The CAS access time indicates the number of CPU clocks in which CAS is required to remain active for a valid access. The RAS-to-CAS access time is similar to the CAS access time, but represents the time from RAS active before CAS is allowed to go active. The RAS-to-CAS access time plus the CAS access time equals the required RAS access time. The RAS Precharge time represents the required number of clocks for RAS to remain high before accessing with an active low.

In the currently preferred embodiment, the RAS/CAS timing parameter field consists of bits 8–15 in the bank configuration register. Furthermore, the CAS access time is represented in bits 8–10, the RAS-to-CAS access time is represented in bits 12 and 13, and the RAS Precharge time is represented in bits 14–15 of the RAS/CAS timing parameter field.

In the currently preferred embodiment, the following CAS access times (i.e., the active pulse width) are utilized:

TABLE 1

| Bits 10:8 | CAS Access Time |
| --- | --- |
| 100 | 0.5 clocks (1 phase) |
| 000 | 1 clock |
| 001 | 2 clocks |
| 010 | 3 clocks |
| 011 | 4 clocks |

Also in the currently preferred embodiment, the following RAS to CAS access times are utilized:

TABLE 2

| Bits 13:12 | RAS to CAS Access Time |
| --- | --- |
| 00 | 1 clock |
| 01 | 2 clocks |
| 10 | 3 clocks |
| 11 | 4 clocks |

Also in the currently preferred embodiment, the following RAS precharge times are available:

TABLE 3

| Bits 15:14 | RAS Precharge Time |
| --- | --- |
| 00 | 1 clock |
| 01 | 2 clocks |
| 10 | 3 clocks |
| 11 | 4 clocks |

The Row Address MUX control field controls the address MUX and WE/CAS output pin definition. In the currently preferred embodiment, the Row Address MUX control field comprises a row address sub-field and a WE/CAS ORing sub-field. The row address sub-field defines the row address configuration of DRAM bank. In the currently preferred embodiment, if the given bank of DRAM requires addressing of a specified number of rows and a specified number of columns, then the bits are programmed in a predetermined manner, such that the DRAM controller generates the proper row and column addressing scheme. For instance, if a given bank of DRAM requires addressing of 9 row bits and 9 column bits, then the bits in the sub-field are programmed to 00H. If the DRAM requires 13 row bits and 11 column bits, then this sub-field is programmed to 03H.

In the currently preferred embodiment, the row address sub-field comprises 4 bits from 16-19 of each bank register. Table 4 below illustrates the currently preferred embodiment of the value to which the sub-field should be programmed for its corresponding row/column addressing scheme:

TABLE 4

| RXC | Value |
| --- | --- |
| 9 × 9 | 00H |
| 10 × 9 | 00H |
| 10 × 10 | 01H |
| 11 × 10 | 01H |
| 12 × 10 | 01H |
| 11 × 11 | 03H |
| 12 × 11 | 03H |
| 13 × 11 | 03H |
| 12 × 12 | 07H |
| 12 × 8 | 08H |

Table 5 depicts the bits designation utilized in the row address according to the bit settings of bits 16-19 of the address multiplexer control field of the currently preferred embodiment to effectuate the various row and column addressing schemes of Table 4:

TABLE 5

| Bit 16 | Bits 19 and 17 | Bit 18 |
| --- | --- | --- |
| 0 - A11 | 00 - A23 - A12 | 0 - A13 |
| 1 - A21 | 01 - A24 - A23 | 1 - A25 |
|  | 01 - A21 - A12 |  |

The other sub-field in the MUX control field defines whether WE ORing or CAS ORing is active. By setting the bits in the sub-field, the present invention supports DRAM card organizations which allow for either only one CAS and two WE signals or two CAS signals and one WE signal.

A predetermined number of bits in the field indicate whether the WE ORing is active (i.e., to be used). WE ORing is when a 16-bit DRAM card is employed which supports two CAS lines and one WE signal. When selected, the second and third WE signals, WE2 and WE3 are ORed together and output on WE2 for that particular bank. Similarly, when selected, the WE1 and WE0 signals of the DRAM controller are ORed and output on WE0. In this situation, WE3 and WE1 remain inactive. Since the write enable signals are used to across all five banks, the mode of these pins will change depending on which bank is currently selected and whether bits corresponding to WE active in that banks register are set. In the currently preferred embodiment, the WE ORing sub-field comprises 1 bit, bit 20, in each of the bank configuration registers.

One of the other sub-fields in CAS/WE generating portion of the bank configuration registers represents whether a common WE signal (WEC) is being utilized. When active, the WEC is driven for all of the data lines, while the WE [3:0] signals are disabled. In the currently preferred embodiment, the WE common, or WEC, is used for 32-bit memory cards. In the currently preferred embodiment, the common WE enable sub-field comprises 1 bit, bit 21, of each bank configuration register.

Another portion of the sub-field for CAS/WE generation indicates if CAS byte ORing is to occur. CAS byte ORing is used in the currently preferred embodiment when a 16 bit DRAM card is used which supports one CAS signal and two WE signals. When selected, the CAS signals for that particular bank will be ORed together. For instance, if CAS byte ORing is selected for bank X, CASX3 and CASX2 will be ORed together and output on CASX2, while CASX1 and CASX0 will be ORed together and output CASX0. In the currently preferred embodiment, the CAS byte ORing sub-field comprises 1 bit, bit 22, of each bank configuration register.

Another sub-field indicates whether CAS bank ORing is to be utilized. In the currently preferred embodiment, CAS bank ORing exists only in two pairs of the five DRAM banks, banks 2 and 3, and 4 and 5. The bit field in bank 2 controls CAS ORing between banks 2 and 3, while the bit in bank 4 controls CAS ORing between banks 4 and 5. When set for banks 2 and 3, the CAS3 output is disabled, while the CAS2 output goes active for accesses to either bank 2 or 3. When set for banks 4 and 5, the CAS5 output becomes disabled, while the CAS4 output operates for accesses to either banks 4 or 5. When pipeline cycles occur between 2 and 3, or between 4 or 5, a wait state is asserted to insure no overlap of the previous CAS signals and the next RAS signals occurs. In the currently preferred embodiment, the CAS bank ORing sub-field comprises 1 bit, bit 23, of each bank configuration register.

In the currently preferred embodiment, the row address MUX control field consists of bit 16-23 in the bank configuration registers. Furthermore, bits 16-19 define DRAM row address configuration, while bits 20-23 define whether WE ORing or CAS ORing are active.

Another sub-field in each of the bank configuration registers indicates the refresh mode for the DRAM used in a particular bank. If programmed for selfrefresh, then that RAS/CAS signal of the bank will remain in a locked low state during refresh. Any banks not programmed for self-refresh will use a clock as the request mechanism and toggle RAS with CAS remaining low throughout the powering down. In the currently preferred embodiment, the self-refresh subfield comprises 1 bit, bit 24, of each bank configuration register.

The currently preferred embodiment of the DRAM controller of the present invention is shown in FIG. 4. Referring to FIG. 4, the DRAM controller 400 consists of bus tracker, decoder and register block 401, refresh logic 402, address decode 407, control logic 406, address MUX logic 408, output logic 405, watch dog timer 404 and parity logic 403. Bus tracker, decoder and register block 401 is coupled to host data bus 450. Also block 401 is coupled to receive a control input on line 426 from the host and a bank description number on line 427 from address decode 407. Register block 401 produces an output on line 424 which is sent to the address decode 407. Register block 401 also produces an output on line 444 which is coupled to output logic 405. Refresh logic 402 is coupled to receive a control input on line 425 from the host and produces RAS/CAS enable signals on line 421 which are output to and coupled to output logic 405. Address decode 407 is coupled to receive address bits 11-28 on lines 433 from the host as well as the register outputs on line 424 from block 401. Address decode 407 also is coupled to receive a latch signal 440 from control logic 406. Address decode 407 produces the bank number signal and outputs it on line 428 to which control logic 406, output logic 405 and block 401 are all coupled to receive. It should be noted that line as used in this application include multiple conductors.

Address decode 407 also outputs address bits 16-25 on line 431 to address MUX logic 408 which is coupled to receive them. Address MUX logic 408 is also coupled to receive state signals on line 429 from control logic 406, a MUX control signal on line 430, and address bits 2-15 on line 432 from the host. In response to the inputs, MUX logic 408 produces the memory address on bits 0-12 as an output to main memory.

Parity logic 403 produces parity error data on line 441 for host processor and is also coupled to host data bus 450. Parity logic 403 also outputs parity data on line 443, the use of which is well-known in the art. Watch dog timer 404 is coupled to receive the RAS signals output from output logic 405 (on line 445) and produces an output of line 420 to control logic 406 which is coupled to receive it. Output logic 405 is coupled to receive a set/reset signal on line 442 from control logic 406, write enable signals on line 422 from the host, the bank description signals on line 428 from address decode 407 and the RAS/CAS enable signals from refresh logic 402. In response, output logic 405 produces the RAS signals, the CAS signals, WE signals, and the WE common signal WEC for each of the banks of the memory. The RAS, CAS, WE, and WEC, and memory address signals are all output to main memory via the output pin interface (not shown).

Block 401 controls access to all of the configuration registers of the present invention. The accesses are controlled by a state machine called the bus tracker which keeps track of all cycles on host bus 450 by examining the host bus signals. The bus tracker ensures that a valid address has been decoded. In the currently preferred embodiment, the configuration memory space holding the five bank configuration registers is within two ranges of 300-3FF and 700-7FF. The register outputs are input into address decode 407.

The bank signals 427 are used to select the appropriate register for the current bank in block 401. The chosen register contains the programmed information of the bank the host is currently accessing and is output on line 444 to output logic 405. This information is then dynamically used to logically "OR" the CAS or WE signals (if necessary for the bank) prior to being clocked out to the main memory.

Address decode 407 is responsible for remapping the incoming host bus address signals on 433, generating the bank select signals on lines 427 and 428 and generating the bank/page hit/miss signals. Within the address decode 407 is the address remapping block, the bank decoding block and the bank/page hit/miss decision block. The address remapping block translates bits 16-25 of the bank configuration register to determine the proper addressing modes of the DRAM. In response, the address remapping block outputs the address to MUX 408. The bank select signal is also generated in response to the address and output to the control logic 406, output logic 405 and to block 401. The bank select signal is generated using random logic.

Control logic 406 contains the main state machine for controlling cycles to DRAM. All control activities in the DRAM controller concerning DRAM cycles typically make use of state outputs from the state transitions. Control logic 406, in conjunction with output logic 405, controls the driving of the CAS signals with the appropriate bytes.

Address MUX logic 408 is partitioned into three blocks: a row address generator, a column address generator and a MUX controller. The row address generator latches addresses on line 431 and performs address line swap operation based on information stored in the bank registers. The column address generator latches addresses from the host bus and generates the first column address. It also generates subsequent column addresses in the case of a burst cycle. The MUX controller controls the MUX select line to determine when to drive the row addresses and the column addresses.

Output logic 405 produces the DRAM and internal control signals. DRAM signals are RAS, CAS, and WE signals. Internal control signals include data buffer enables, watch-dog reset and byte-enable signals. Five microcells are employed to produce five RAS signals corresponding to the five separate banks of memory. Output logic 405 combines the byte enables (line 422) and the RAS/CAS signals with the appropriate bytes.

The RAS, CAS, and We signals are generated from random logic. The logic circuitry consists of combinatorial logic using the byte enables and row or column decoding. The byte enables and decoding of column addresses are clocked by the control logic and then drive the CAS signal when valid column addresses are decoded. When a valid physical address from the host bus is decoded, the boundary field is used to determine if the address is within the appropriate column and row address range of a bank. If the address falls within a bank range from a corresponding row and column address range, the RAS signal is driven with a multiplexed row address. Likewise, if the host bus is driving a write cycle, the WE signal is driven prior to the CAS signal. The CAS and WE signals are further qualified by the bus state tracker 401 and control logic 406 to ensure relative timing margins are met with respect to valid column address and RAS signals. In the currently preferred embodiment, proper timings are ensured through the use of S-R flip-flops which are clocked to output the CAS and WE signals.

In the currently preferred embodiment, the byte enable signals are logically "ANDed" with their respective CAS enable signal to generate the CAS0-CAS3 signals for a DRAM bank.

The write enable logic examines the state of the write-read at the beginning of each cycle to decide whether it is a write signal or not. If it is a write signal, then the write signal associated with the enabled byte will be asserted. In other words, the WE goes active at least one phase prior to the CAS going active. The WE signal is to be de-asserted at the end of the cycle. The WE signals are de-asserted during a refresh cycle.

The output logic 405 of the present invention also generates a WE common signal (WEC). The WEC bit, when enabled, causes the WEC signal to be asserted at any time a write cycle to the memory takes place, while the other WE signals are disabled.

Output logic 405 also generates data buffer control signals consisting of four lines of input enables, four lines of output enables and one line of latch enables.

An output buffer 409 buffers all of the outputs of output logic 405. Furthermore, output buffer 409 provides the CAS byte ORing. Output buffer 409 is capable of logically ORing CAS0 and CAS1 and logically ORing CAS2 and CAS3 when the CAS byte/bank ORing is enabled.

Parity logic 403 generates the parity for the data signals on the data line 441. Refresh logic 402 provides a variety of refresh options with a DRAM. Refresh logic 402 is divided into two major parts consistent with the number of refresh options. The options include self-refresh and clocked refresh. Also, the rate of refresh can be programmed in a configuration register. Watch-dog timer 404 consists of a down timer which keeps track of the time for which the active RAS has remained active. When the RAS lines are going active (as indicated in line 445), the timer is reset. The timer starts counting when any of the RAS lines are active. A timeout signal is generated whenever the timer has counted down to zero and any of the RAS lines are still active. The timing out of watch-dog timer 404 forces a page miss cycle.

Thus, the present invention comprises independent configuration registers which control individual CAS and WE signal generation for a memory array having DRAMs. The CAS/WE generation is capable of internally ORing the CAS and WE signals for any bank. Thus, the present invention allows the use of any organization of DRAMs to be used in different DRAM banks independently of other DRAM banks.

Furthermore, the present invention provides internal logic to control CAS and WE signals to allow guaranteed A.C. timing to the DRAM. This eliminates the need for computer systems to provide for external logic delays. Moreover, the integration of logic OR functions for CAS and WE signal generation in the device also reduces external logic required to design a system without sacrificing flexibility and performance by being able to change the type of DRAM without having to add additional hardware.

Whereas many alterations upon applications of the present invention will no doubt become apparent to a person of ordinary skill in the art after having read the foregoing description, it is understood that the particular embodiment shown and described by illustration is in no way intended to be limiting. Therefore, reference to details of the preferred embodiments are not intended to limit the scope of the claims which themselves recite only those features regarded as essential to the invention.

Thus, a DRAM controller which accommodates multiple types of DRAMs has been described.

We claim:

1. A memory controller apparatus for providing access to a memory array including at least one dynamic random access memory (DRAM) bank, said apparatus adaptable to various types of DRAM banks, wherein each of said bank types are defined according to their individual access parameters, the apparatus comprising:

at least one programmable storage means, said at least one programmable storage means being associated with said at least one bank, said at least one programmable storage means being programmed to contain access parameters necessary to access its associated bank, wherein a portion of said at least one storage means defines control signals for said at least one DRAM bank such that memory interface circuitry provides the column address strobe (CAS) signals and write enable (WE) signals required to access said at least one bank; and said memory interface circuitry coupled to said storage means and adapted to generating memory control signals with the proper sequence and timing for said at least one bank according to the access parameters in its associated programmable storage means, wherein when said at least one programmable storage means is loaded with a first set of access parameters said memory interface circuitry generates control signals for a first type of DRAM bank and if said at least one programmable storage means is loaded with a second set of access parameters said memory interface circuitry generates control signals for a second type of DRAM bank, such that said memory controller is capable of accommodating DRAM banks of different types in the memory array.

2. The apparatus as defined in claim 1 wherein said storage means comprises a plurality of registers.

3. The apparatus as defined in claim 1 wherein a portion of said at least one storage means controls the CAS signal generation, wherein said memory circuitry performs a logical ORing operation on the CAS signals, such that the CAS signals required to access said at least one bank are generated.

4. The apparatus as defined in claim 1 wherein a portion of said at least one storage means controls the WE signal generation, said memory circuitry performing a logical ORing function on the WE signals, such that the WE signals required to access said at least one bank are generated.

5. The apparatus as defined in claim 1 wherein a portion of said at least one storage means controls the row and column address strobe timing parameters to access said at least one bank.

6. The apparatus as defined in claim 1 wherein a portion of said at least one storage means indicates the address configuration for its associated bank, such that said the proper addressing for the associated bank is generated.

7. The apparatus as defined in claim 1 wherein a portion of said at least one storage means indicates the memory refresh mode for its associated bank, such that said memory circuitry generates the proper control signals for refreshing the associated bank.

8. A memory controller apparatus for providing access to a memory array including a plurality of dynamic random access memory (DRAM) banks, said apparatus adaptable to various types of DRAM banks, wherein each of said bank types are defined according to their individual access parameters, the apparatus comprising:
- a plurality of programmable registers, each of said plurality of programmable registers being associated with one of said plurality of banks, each of said plurality of programmable registers defining access parameters necessary to access its associated bank, wherein a portion of each of said registers controls the column address strobe (CAS) signals for its associated bank; and
- memory interface circuitry coupled to said plurality of registers and adapted to generating memory control signals with the proper sequence and timing for each of said banks according to the access parameters in its associated programmable register, wherein said memory circuitry is configured with said parameters of said given DRAM bank type such that when one of said programmable registers is loaded with a first set of access parameters said memory interface circuitry generates control signals for a first type of DRAM bank and if one of said programmable registers is loaded with a second set of access parameters said memory interface circuitry generates control signals for a second type of DRAM bank, such that said memory circuitry adapts to said given DRAM type to provide access and the memory array is capable of accommodating DRAM banks of different types in the memory array.

9. The apparatus as defined in claim 8 wherein a portion of each of said registers controls the write enable (WE) signals for its associated bank.

10. The apparatus as defined in claim 9 wherein a portion of each of said registers controls whether the memory circuitry performs WE signal ORing to generate the requisition WE signals to access its associated bank.

11. The apparatus as defined in claim 8 wherein a portion of each of said registers controls whether the memory circuitry performs CAS byte ORing to generate the CAS signals for its associated bank.

12. The apparatus as defined in claim 8 wherein a portion of each of said registers controls whether the memory circuitry performs CAS bank ORing to generated the CAS signals for its associated bank.

13. The apparatus as in claim 8 wherein a portion of each of said register indicates whether a single write enable is to be supplied to its associated bank, such that said memory circuitry generates said single write enable.

14. The apparatus as defined in claim 8 wherein a portion of each of said registers indicates the memory range for its associated bank, such that said plurality of banks forms one continuous memory range.

15. A method of providing access to a memory array including at least one dynamic random access memory (DRAM) bank using a memory controller, said controller adaptable to various types of DRAM banks, wherein each of said bank types are defined according to their individual access parameters, the method comprising the steps of:
- programming at least one programmable storage means with a first set of access parameters, said at least one programmable storage means being associated with said at least one bank, said at least one programmable storage means being programmed to contain said first set of access parameters necessary to access a first type of DRAM bank; and
- configuring the interface to each of said banks, wherein memory interface circuitry generates memory control signals with the proper sequence and timing for said at least one bank according to the access parameters in its associated programmable storage means wherein said memory interface circuitry generates control signals for said first type of DRAM bank and if said at least one programmable storage means is loaded with a second set of access parameters said memory interface circuitry generates control signals for a second type of DRAM bank, such that said memory array is capable of accommodating DRAM banks of different types in the memory array.

* * * * *